United States Patent [19]

Nath et al.

[11] Patent Number: 4,746,618
[45] Date of Patent: May 24, 1988

[54] METHOD OF CONTINUOUSLY FORMING AN ARRAY OF PHOTOVOLTAIC CELLS ELECTRICALLY CONNECTED IN SERIES

[75] Inventors: Prem Nath, Rochester; Timothy Barnard, Lake Orion, both of Mich.

[73] Assignee: Energy Conversion Devices, Inc., Troy, Mich.

[21] Appl. No.: 91,475

[22] Filed: Aug. 31, 1987

[51] Int. Cl.[4] .......................................... H01L 31/18
[52] U.S. Cl. ......................................... 437/2; 437/4; 437/51; 437/205; 136/244; 136/258
[58] Field of Search ................. 437/2, 4, 51, 64–65, 437/205, 211, 225, 228; 136/244, 258 AM

[56] References Cited

U.S. PATENT DOCUMENTS

3,977,904 8/1976 Köhler ................................ 136/246
4,245,386 1/1981 Kausche et al. ......................... 437/2

Primary Examiner—Aaron Weisstuch
Attorney, Agent, or Firm—Richard M. Goldman; Marvin S. Siskind

[57] ABSTRACT

A method of continuously electrically interconnecting in series a plurality of smaller area photovoltaic cells from a continuous, elongated web of photovoltaic cell material which is maintained in continual motion.

15 Claims, 3 Drawing Sheets

METHOD OF CONTINUOUSLY FORMING AN ARRAY OF PHOTOVOLTAIC CELLS ELECTRICALLY CONNECTED IN SERIES

FIELD OF THE INVENTION

This invention relates generally to methods of fabricating relatively large area photovoltaic devices and more particularly to a method of forming and electrically interconnecting in series a plurality of photovoltaic cells from a moving web of photovoltaic cell material.

BACKGROUND OF THE INVENTION

Owing to the increasing scarcity of non-renewable energy reserves such as coal, petroleum and uranium, it is essential that increased use be made of alternative non-depletable energy sources, such as photovoltaic energy. Single crystal photovoltaic devices, especially crystallline silicon photovoltaic devices, have been utilized for some time as sources of electrical power because they are inherently non-polluting, silent and consume no expendable natural resources in their operation. However, the utility of such crystalline devices has been limited by problems associated with the manufacture thereof. More particularly, single crystalline materials are: (1) difficult to produce in sizes substantially larger than several inches in diameter, (2) thicker and heavier than their thin film counterparts; (3) fragile and therefore susceptible to breakage; and (4) expensive and time consuming to fabricate.

Recently, considerable effort has been expended to develop systems and processes for preparing thin film amorphous semiconductor alloy materials which encompass relatively large areas and which can be deposited so as to form p-type and n-type semiconductor alloy layers for the production therefrom of thin film photovoltaic devices which are substantially equivalent or superior to their crystalline counterparts in operation and efficiency. It should be noted at this point that the term "amorphous" as used herein, is defined to include alloys or materials exhibiting long range disorder, although said alloys or materials may exhibit short or intermediate range order or even contain crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur. It is to be noted that pursuant to the foregoing definitions, the microcrystalline, p-doped, wide band gap, semiconductor alloy material, referred to herein, falls within the generic term "amorphous".

As mentioned hereinabove, amorphous thin film semiconductor alloys have gained acceptance for the fabrication of photovoltaic cells therefrom. This is because the amorphous thin film semiconductor alloys (1) can now be manufactured by relatively low cost continuous processes, (2) possess a wide range of controllable electrical, optical, and structural properties and (3) can be deposited to cover relatively large areas. Among the semiconductor alloy materials exhibiting the greatest present commercial significance are amorphous silicon, amorphous germanium and amorphous silicon-germanium based alloys. Such alloys have been the subject of a continuing development effort on the part of the assignee of the present invention. More specifically, the assignee of the present invention is recognized as the world leader in photovoltaic technology. Photovoltaic devices produced by said assignee have set world records for photoconversion efficiency and long term stability under operating conditions (the efficiency and stability considerations will be discussed in greater detail hereinbelow). Additionally, said assignee has developed commercial processes for the continuous roll-to-roll manufacture of large area photovoltaic devices.

In this roll-to-roll processing, a web of substrate material may be continuously advanced through a succession of operatively interconnected, environmentally protected deposition chambers, wherein each chamber is dedicated to the deposition of a specific layer of semiconductor alloy material onto the web or onto a previously deposited layer. In making a photovoltaic device, for instance, of n-i-p type configuration, the first chamber is dedicated for the deposition of a layer of an n-type semiconductor alloy material, the second chamber is dedicated for the deposition of a layer of substantially intrinsic amorphous semiconductor alloy material, and the third chamber is dedicated for the deposition of a layer of a p-type semiconductor alloy material. The layers of semiconductor alloy material thus deposited in the vacuum envelope of the deposition apparatus may be utilized to form photoresponsive devices, such as, but not limited to, photovoltaic devices which include one or more cascaded n-i-p type cells. By making multiple passes through the succession of deposition chambers, or by providing one or more additional triads of deposition chambers, multiple stacked cells of various configurations may be obtained. Note, that as used herein, the term "n-i-p type" will refer to any sequence of n and p or n, i and p layers of semiconductor alloy material operatively disposed and successively deposited to form a photoactive region wherein charge carriers are generated by the absorption of photons from incident radiation.

The concept of utilizing multiple stacked cells, to enhance photovoltaic device efficiency has been known since at least as early as 1955. Essentially, the concept employs different band gap devices to more efficiently collect various portions of the solar spectrum and thereby increase open circuit voltage (Voc). The tandem cell device (by definition) incorporates two or more stacked cells with the light directed serially through each cell. In the first cell, a large band gap semiconductor alloy material absorbs only the short wavelength light, while in subsequent cells, smaller band gap semiconductor alloy materials are employed to absorb the longer wavelengths of light which pass through the first cell. By substantially matching the photogenerated currents from each cell of the tandem arrangement, the overall open circuit voltage becomes the sum of the open circuit voltage of each cell, while the short circuit current thereof remains substantially constant. Such tandem cell structures can be relatively economically fabricated in large areas by employing thin film amorphous, semiconductor alloy materials (with or without crystalline inclusions). It should be noted that when crystalline semiconductor materials are employed for the fabrication of stacked cell structures, it is virtually impossible to match the lattice constants of the different crystalline materials thereof. Therefore, it is not possible to fabricate such crystalline tandem cell structures in a commercially feasible manner. In contrast thereto, and as the assignee of the instant invention has shown, such tandem cell structures are not only possible, but can be economically fabricated over large areas by employing the amorphous semiconductor alloy materials and the deposition techniques discussed and briefly described herein.

More particularly, the assignee of the instant invention is presently able to manufacture stacked, large area photovoltaic devices on a commercial basis by utilizing the previously referenced, continuous deposition, roll-to-roll processor. That processor is characterized as a 1.5 megawatt capacity machine insofar as its annual output of photovoltaic devices is capable of producing 1.5 megawatts of electrical power. Said 1.5 megawatt processor, as presently configured, is adapted to produce tandem photovoltaic cells which comprise two stacked n-i-p type photovoltaic devices disposed optically and electrically in series upon a stainless steel substrate. The processor currently includes six operatively interconnected, dedicated deposition chambers, each deposition chamber adapted to sequentially deposit one of the layers of semiconductor alloy material from which the tandem device is fabricated.

Despite the fact that non-polluting, non-depletable photovoltaic energy is so attractive and despite the fact that Applicants' assignee has been able to develop production apparatus in which thin film photovoltaic devices can be manufactured in a continuous roll-to-roll process, the cost in dollars per peak watt of power generated by thin film photovoltaic devices remains too high to be cost competitive with conventional energy sources. One reason for this relatively high cost is that while the aforementioned continuous roll-to-roll manufacture of thin film photovoltaic devices has reduced the deposition expense as compared to the expense of batch depositing those devices, in order to series connect discrete devices, it has heretofore been necessary to sever said devices from the web and then electrically and mechanically reconnect the severed devices in said series relationship. The processing steps involved in the severing of discrete devices, electrically interconnecting in series those severed devices, and mechanically reconnecting the severed, electrically interconnected devices could not be accomplished in roll-to-roll fashion, was labor intensive, time consuming and hence, expensive.

It is therefore the principle object of the subject invention to provide a continuous, roll-to-roll process for electrically interconnecting in series a plurality of discrete small area photovoltaic cells, which process is simple and cost effective.

This and other objects and advantages of the subject invention will become apparent from a perusal of the drawings, the detailed description of those drawings, and the claims which follow.

BRIEF SUMMARY OF THE INVENTION

There is disclosed herein a method of continuously electrically interconnecting in series an array of photovoltaic cells, said method including the steps of providing an elongated web of continuous photovoltaic cell material, which continuous cell material comprises a continuous substrate upon which continuous thin film layers of semiconductor alloy material are disposed. It is important for purposes of cost reduction that the photovoltaic cell material be continuously moved through processing stations to a take-up station. In its path of travel, at least one slit is formed in said elongated cell, each said slit extending through the semiconductor alloy material and the substrate. The slit is of a length selected to include a non-slitted connector between each terminus of said slit and the edge of said cell proximate thereto so that said non-slitted connectors prevent the division of said elongated photovoltaic cell into a plurality of discrete smaller area photovoltaic cells. Electrical communication is then established between said adjacent smaller area cells which are disposed on opposite sides of said slit. Only at this time are said connectors severed so that said elongated cell is converted into an elongated array of discrete smaller area photovoltaic cells which are electrically interconnected in series.

The method may further include the steps of electrically isolating a minor portion of the surface area of each discrete photovoltaic cell from the remainder of the surface area of each discrete cell by either forming grooves through the layers of semiconductor alloy material deposited upon the continuous substrate or by removing a stripe therefrom, which stripe includes those layers of semiconductor alloy material. These grooves are adapted to expose the subjacent electrically conductive substrate for effecting electrical communication between adjacent small area cells.

At this point, the slits are filled with electrically insulating material so that adjacent smaller area photovoltaic cells are electrically isolated from one another. In the event that an electrically conductive substrate is used, the back surface of the substrate is laminated with an electrically insulating encapsulating material prior to insulating the slitted space between adjacent cells with the electrically insulating material. In those instances in which an electrically insulating substrate is utilized, a continuous layer of electrically conductive material is deposited upon said insulating substrate prior to slitting said continuous photovoltaic cell into the plurality of smaller area cells and the slitted space between adjacent cells is insulated with an electrically insulating material. The electrically isolated adjacent cells are then electrically interconnected across said insulated slit by forming a plurality of electrically conductive grid lines which extend from said major portion of said surface area of one discrete cell to said minor portion of said surface area of said adjacent discrete cell, whereby the upper surface of each smaller area cell is electrically interconnected in series to the lower electrode surface of said adjacent cell. In another embodiment of electrically interconnecting adjacent cells is the step of forming at least one bus bar which electrically interconnects the plurality of grid lines of one cell to the substrate electrode of the adjacent cell.

It may thus be seen that in the aforementioned manner, a plurality of discrete smaller area cells may be electrically interconnected in series so as to obtain a desired voltage therefrom. Finally, the upper surface of the discrete electrically interconnected photovoltaic smaller area cells are encapsulated with an electrically isolating laminate material.

In its broadest form, there is described herein an improved method of electrically interconnecting in series an array of photovoltaic cells in which successive continuous layers of semiconductor alloy material are deposited onto an elongated web of substrate material so as to form an elongated web of continuous photovoltaic cell material. This method includes the specific steps of forming a plurality of discrete smaller area photovoltaic cells from the single cell and electrically interconnecting those discrete cells in series while maintaining the web in continuous motion. According to this method, at least one slit is formed in said elongated cell so as to extend through the semiconductor alloy material and the substrate, said slit being of a length which leaves a non-slitted connector between each terminus of said slit and the edge of said cell proximate thereto. Again, the electrical communication is preferably formed between the cells which are disposed on opposite sides of said slits. The fabrication may be completed by encapsulating both sides of the photovoltaic cell material and by severing the number of discrete cells from the web which will provide the preselected voltage.

DETAILED DESCRIPTION OF THE DRAWINGS

I. The Photovoltaic Cell

Figure 1:
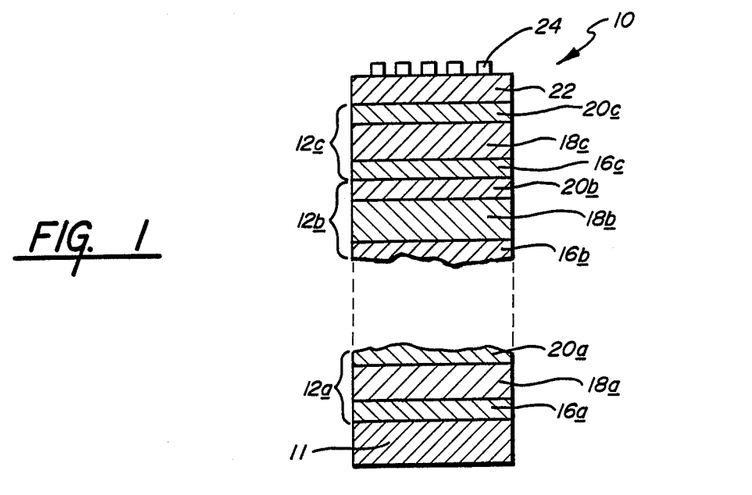
FIG. 1 is a fragmentary, cross-sectional view of a tandem photovoltaic device of the type which may be employed in the practice of the instant invention, said device comprising a plurality of stacked n-i-p type photovoltaic cells.

Referring now to the drawings and particularly to FIG. 1, a photovoltaic cell, formed of a plurality of successively deposited n-i-p layers, each of which includes, preferably, a substantially amorphous thin film semiconductor alloy material is shown generally by the reference numeral 10.

More particularly, FIG. 1 shows an n-i-p type photovoltaic device, such as a solar cell, made up of individual n-i-p type cells 12a, 12b and 12c. Below the lowermost cell 12a is a substrate 11 which may be formed of a transparent glass or synthetic polymeric member; or formed from a metallic material such as stainless steel, aluminum, tantalum, molybdenum, chrome; or formed from metallic particles embedded within an insulator. Although certain applications may require the deposition of a thin oxide layer and/or a series of base contacts prior to the deposition of semiconductor alloy material, the term "substrate" shall include not only a flexible film, but also any elements added thereto by preliminary processing. Also included within the scope of the present invention are substrates formed of synthetic polymers and, metals coated with a synthetic polymer to which one or more conductive base electrodes are applied.

Each of the cells 12a, 12b and 12c is preferably fabricated with a thin film semiconductor body containing at least a silicon or silicon:germanium alloy. Each of the semiconductor bodies includes a p-type conductivity semiconductor layer 20a, 20b or 20c; a substantially intrinsic semiconductor layer 18a, 18b or 18c; and an n-type conductivity semiconductor layer 16a, 16b or 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Similarly, the tandem cell may include only two stacked cells. Also, although n-i-p photovoltaic cells are illustrated, this invention may be advantageously practiced with differently configured photovoltaic cells including single or multiple p-i-n cells, Schottky barrier cells, p-n cells as well as with any other semiconductor device having an appropriate top electrode. The term "n-i-p type" as used herein is meant to include any aggregation of n, i and p layers operatively disposed to provide a photoactive region for generating charge carriers in response to the absorption of photon energy.

It is to be understood that following the deposition of the layers of semiconductor alloy material, a further deposition process may be either performed in a separate environment or as a part of a continuous process. In this step, a TCO (transparent conductive oxide) layer 22, preferably formed of a material such as tin oxide, indium oxide, indium tin oxide, zinc oxide, cadmium stannate or combinations thereof is added atop the p-layer 20c of the top most cell 12c, to function as the top electrode of the cell 10. An electrode grid 24 may be added to the device where the cell is of a sufficiently large area, or if the conductivity of the TCO layer 22 is insufficient to obtain efficient collection of photogenerated current. The grid 24 is adapted to shorten the carrier path and increase the conduction efficiency. As discussed previously, the intrinsic layers 18a, 18b and 18c of the respective cells 12a, 12b and 12c may be and preferably are formed from semiconductor alloy materials having different band-gaps. For example, intrinsic layer 18c of cell 12c may have a band gap of approximately 1.7 eV, intrinsic layer 18b of cell 12b may have a band gap of approximately 1.5 eV and intrinsic layer 18a of cell 12a may have a band gap of approximately 1.3 eV. In this manner, the most efficient use may be made of a large portion of the incident solar spectrum.

II. The Multiple Glow Discharge Deposition Chambers

Figure 2:
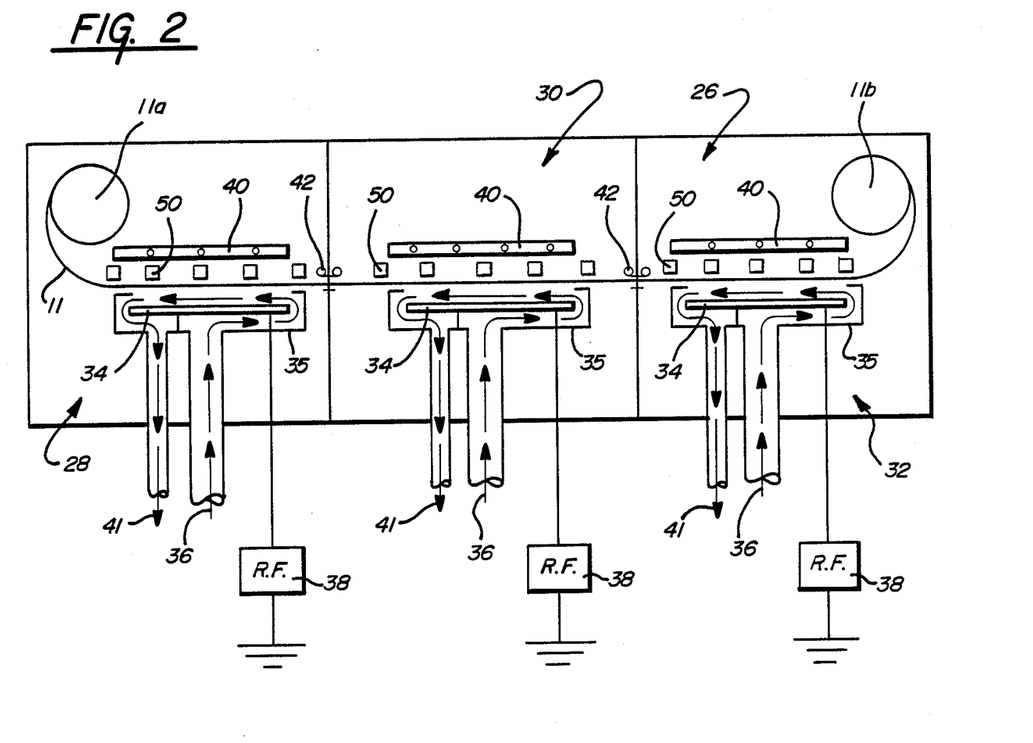
FIG. 2 is a schematic view of a multiple chamber deposition apparatus of the type which may be employed for the fabrication of the tandem photovoltaic cells illustrated in FIG. 1.

Turning now to FIG. 2, a diagrammatic representation of multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate 42 through which (1) sweep gases, and (2) a web of substrate material 11 are adapted to unidirectionally pass. It is in an apparatus of this type that photovoltaic cells similar to the cell 10 of FIG. 1, may be readily manufactured.

The apparatus 26 is adapted to mass deposit amorphous semiconductor layers of n-i-p configuration onto the surface of the web of substrate material 11 which is continually fed therethrough. To deposit the semiconductor layers required for producing multiple n-i-p type cells, the apparatus 26 includes at least one triad of deposition chambers. Each triad of deposition chambers comprises: a first deposition chamber 28 in which a layer of n-type conductivity semiconductor alloy material is deposited onto the deposition surface of the substrate 11 as the substrate 11 passes therethrough; a second deposition chamber 30 in which a layer of intrinsic semiconductor alloy material is deposited atop the p-type layer on the deposition surface of the substrate 11 as the substrate 11 passes therethrough; and a third deposition chamber 32 in which a layer of p-type semiconductor alloy material is deposited atop the intrinsic layer on the deposition surface of the substrate 11 as the substrate 11 passes therethrough. It should be apparent that (1) although only one triad of deposition chambers has been illustrated, additional triads or additional individual chambers may be added to the apparatus to provide the machine with the capability of producing photovoltaic cells having any number of n-i-p type semiconductor layers; (2) the substrate supply core 11a and the substrate take-up core 11b are shown in the deposition chambers for illustrative purposes only, while in reality the cores would be housed in separate chambers operatively connected to the deposition chambers; (3) although the glow discharge illustrated herein employs cathodes with r.f. power, other energy supplies, such as a.c. power generators, microwave generators and d.c. power generators, may be employed without departing from the spirit or scope of the present invention; and (4) the gaseous precursor source of semiconductor alloy material may be introduced to flow in a direction transverse, parallel, or parallel but opposite to the direction of substrate travel.

Each deposition chamber, 28, 30 and 32 of the triad is adapted to deposit a single layer of semiconductor alloy material, by glow discharge deposition, onto the electrically conductive substrate 11. To that end, each of the deposition chambers 28, 40 and 32 includes: a cathode 34; a shield 35 disposed about each of the cathodes 34; a process gas supply conduit 36; a radio frequency generator or other source of electromagnetic power 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber.

The supply conduits 36 are operatively associated with the respective cathodes 34 and other decomposition mechanisms to deliver process gas mixtures to the plasma, or other decomposition regions created in each deposition chamber between said decomposition mechanism and the substrate 11. The cathode shields 35 are adapted to operate in conjunction with the web of substrate material 11 and the evacuation conduit 41 to confine the process gases within the cathode region of the deposition chambers.

The radio frequency or other similar type of power generator 38 operates in conjunction with the cathodes 34, the radiant heaters 40 and the grounded substrate 11 to form the plasma by disassociating and recombining the elemental reaction gases entering the deposition chambers into deposition species and compounds. These species and compounds are then deposited onto the bottom surface of the substrate 11 as semiconductor layers. The substrate 11 is maintained substantially flat by the plurality of rows of magnetic elements 50 which provide an attractive force urging the substrate 11 upwardly, out of its normal sagging path of travel. To form the photovoltaic cell 10 illustrated in FIG. 1, an n-type substantially amorphous layer of semiconductor alloy material is deposited onto the substrate 11 in the dopant deposition chamber 28, a layer of substantially intrinsic amorphous semiconductor alloy material is deposited atop the n-type layer in the deposition chamber 30 and a p-type substantially amorphous layer of semiconductor alloy material is deposited atop the intrinsic layer in the deposition chamber 32. As a result, in the preferred embodiment, the apparatus 26 deposits at least three amorphous semiconductor layers onto the substrate 11 with the intrinsic layer deposited in deposition chamber 30 differing in composition from the layers deposited in deposition chamber 28 and 32 by the absence of at least one element which will be referred to as the dopant or doping species.

III. The Continuous Electrical Interconnection Of Cells In Series

Figure 3A:
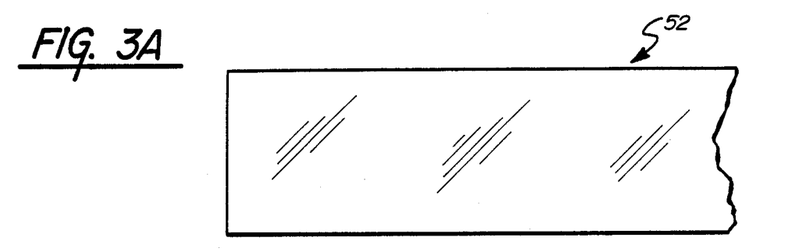
FIG. 3A is a partial top plan view illustrating a continuous web of photovoltaic cell material of the type depicted in FIG. 1.
Figure 4A:
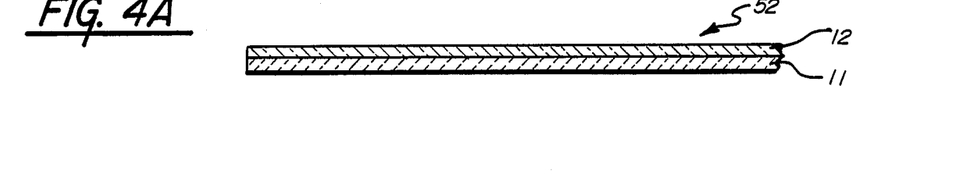
FIG. 4A is a partial cross-sectional view illustrating the continuous web of photovoltaic cell material of FIG. 3A.

Referring now to FIG. 3A and FIG. 4A, there is illustrated the continuous elongated web of photovoltaic cell material, shown generally by the reference numeral 52. It is to be understood that the continuous web of photovoltaic cell material 52 includes a continuous web of substrate material such as previously described with reference to FIG. 1 and designated by the reference numeral 11. Upon that web of substrate material 52 is deposited successive, continuous layers of semiconductor alloy material so as to form a single, elongated, continuous photovoltaic cell 12 thereupon. In the manner previously discussed with respect to FIG. 1, the layers of semiconductor alloy material may be deposited in triads so as to form one or more stacked photovoltaic cells (depending upon the use contemplated for that photovoltaic cell), the layers of semiconductor alloy material generally designated by the reference numeral 12 in FIG. 4A. It is to be understood that the photovoltaic cell further includes upper and lower electrodes (not shown in FIG. 4A). It is further to be noted that the web of substrate material 11 may either be electrically conducting, such as aluminum or stainless steel material; or the web may be electrically insulating such as a polymeric resin, in which case the web would require that a superposed continuous layer of electrically conductive material be deposited thereupon. The essence of the present invention does not reside in the conductivity of the substrate material or in the number of cells deposited thereupon. Rather, the present invention deals specifically with a method of continuously electrically interconnecting in series an array of smaller area photovoltaic cells from a moving single elongated, continuous web of photovoltaic cell material.

Figure 3B:
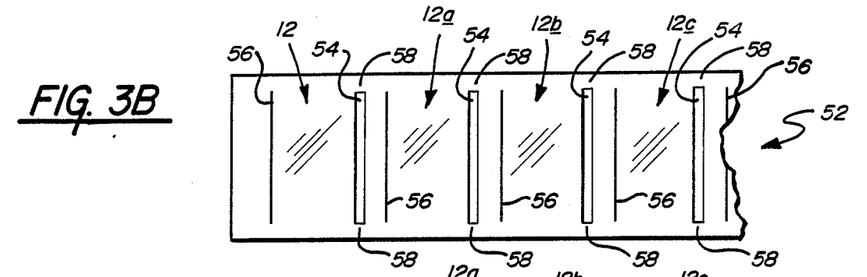
FIG. 3B is a partial top plan view illustrating the continuous web of photovoltaic cell material of FIG. 3A with a plurality of slits cut thereinto and a substrate exposing groove formed in each of the cells thereof.
Figure 4B:
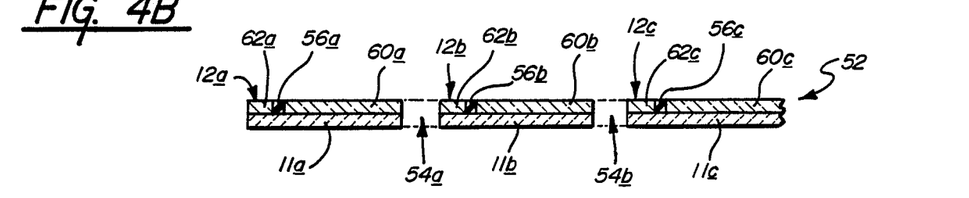
FIG. 4B is a partial cross-sectional view illustrating the continuous web of photovoltaic cell material of FIG. 3B with the slits cut between discrete cells and the isolation grooves formed in the semiconductor alloy material thereof.

Referring now to FIG. 3B, which is a partial top plan view of the continuous web of photovoltaic cell material 52, with FIG. 4B corresponding thereto and showing the same web 52 in cross-section. Processing of the approximately 14 inch wide, 1000 foot long web of photovoltaic material 52 begins by cutting regularly spaced, transversely extending slits 54 thereinto, said slits 54 extending through both the layers of semiconductor alloy material which comprise the photovoltaic cell 12 as well as the substrate 11. The slits, shown electrically and physically separating cells 12a and 12b as well as 12b and 12c, are formed of a length, such as about thirteen inches (so as to define twelve inch long cells), selected to include a non-slitted connector 58 (as shown in the plan view of FIG. 3B), which connector 58 extends between the terminus of each slit 54 and the edge of said elongated web of cell material 52. In this manner, the non-slitted connectors 58 maintain the physical integrity of the elongated continuous photovoltaic cell material 52 and provide for that material 52 to continue to be processed on a roll-to-roll basis. It is to be noted that the slits may be mechanically cut (requiring about 1/16 inch minimum tolerance), water jet cut (requiring about a 15-20 mil tolerance), laser cut by a YAG or $CO_2$ laser (requiring about a 15 mil tolerance) or the slits can be chemically or electrochemically etched.

After the step of slitting the continuous web of photovoltaic cell material 52 has been completed, the elongated web of photovoltaic cell material 52 has been divided up into a plurality of adjacent, discrete, smaller area photovoltaic cells such as 12a, 12b, 12c . . . (each cell being about twelve inches long and two inches wide). It is to be understood that the dimensions of each cell are dependent upon the resistivity of the TCO as well as the number of stacked cells being utilized, which factors significantly effect the current collection capabilities thereof.

In order to electrically interconnect these discrete smaller area photovoltaic cells 12a-12c while the web of photovoltaic cell material 52 continues to move toward a take-up station, it is beneficial to further divide the surface of each of the discrete cells into a major surface area portion and a minor surface area portion. This is accomplished by the instant invention, as illustrated in FIGS. 3B and 4B, by cutting (as by laser welding) a groove, generally 56, through the layers of semiconductor alloy material 12. It is to be noted that the length of the groove 56 is cut so as to be substantially co-extensive with the length of the slit 54 formed through the layers of semiconductor alloy material 12 and the substrate 11. The purpose of the grooves, shown as 56a-56c in FIG. 4B, is to (1) divide each of the discrete cells 12a-12c, respectively, into a major surface area portion 60a-60c, and a minor surface area portion 62a-62c, respectively; and (2) expose the electrically conductive substrate for effecting a series connection between said adjacent discrete cells. As an alternative method of exposing the substrate and isolating the major surface area portion 60a-60c from the minor surface area portion 62a-62c of each cell 12a-12c, respectively, it is possible to etch the semiconductor alloy material from the minor cell area portion 62. This etching step can be effected either after the continuous layers of semiconductor alloy material 12 are deposited or by a masking step which prevents the initial deposition of the layers of semiconductor alloy material atop the minor surface area portions 62a-62c of the discrete small area cells such as 12a-12c, respectively.

Figure 3C:
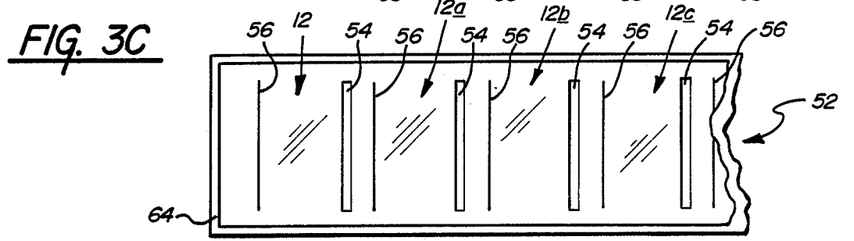
FIG. 3C is a partial plan view illustrating the continuous web of photovoltaic cell material of FIG. 3B with an encapsulant applied to the rear surface thereof and the slits filled with an electrically insulating material.
Figure 4C:
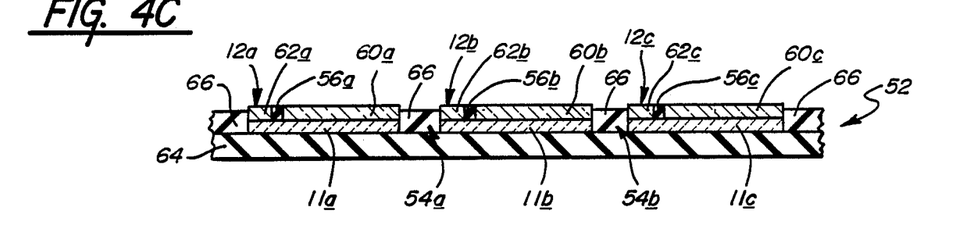
FIG. 4C is a partial cross-sectional view illustrating the continuous web of photovoltaic cell material of FIG. 3C with the electrically insulating material provided between adjacent cells and the rear surface thereof having a laminate disposed thereover.

Turning now to FIG. 3C and corresponding FIG. 4C, the discrete small area cells 12a-12c and the underlying substrate 11a-11c, respectively, are shown with a continuous sheet of electrically insulating rear laminant 64 applied to cover the rear surface thereof, i.e., to the substrate side of the interconnected web of photovoltaic cell material 52. As is also depicted in these drawings, the slitted spaces 54a and 54b which exists between the adjacent discrete smaller area photovoltaic cells 12a-12c are filled with an electrically insulating material such as EVA or another synthetic polymeric resin; this insulating material is designated generally by the reference numeral 66 in FIG. 4C. It is to be understood that said slitted spaces are so filled for the purpose of electrically isolating adjacent cells from one another.

Figure 3D:
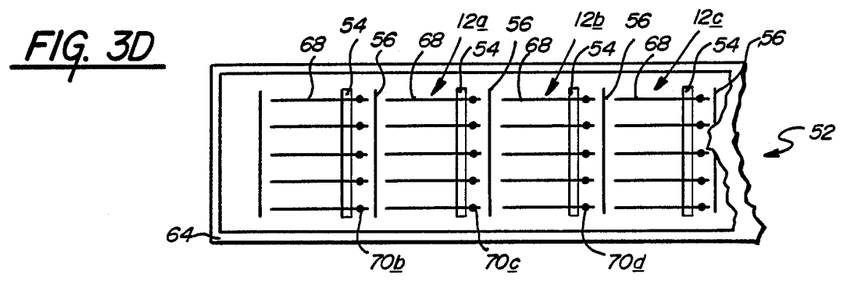
FIG. 3D is a top plan view illustrating the continuous web of photovoltaic cell material of FIG. 3C with the addition thereto of an electrically interconnecting grid extending across the slitted space between discrete cells.
Figure 4D:
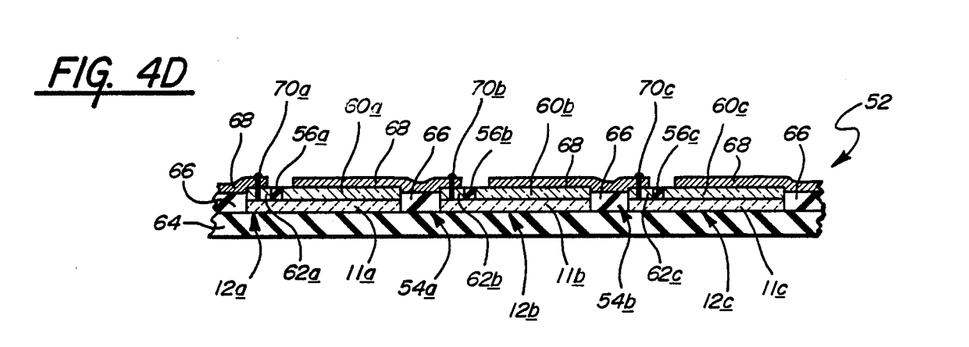
FIG. 4D is a partial cross-sectional view of the continuous web of photovoltaic cell material of FIG. 3D illustrating the electrically interconnecting grid which extends across the insulated slit and separating adjacent cells.

Continuing now with the process of forming the array of discrete smaller area photovoltaic cells, and specifically referring to FIGS. 3D and 4D, there is illustrated therein the elongated web of slitted photovoltaic cell material 52 with said adjacent smaller area photovoltaic cells 12a-12c electrically interconnected in series by a plurality of regularly spaced electrically conducting grid lines or fingers 68. The electrically conducting grid lines 68 are formed as thin metallic fingers which extend from the major portion 60a of one discrete smaller area photovoltaic cell such as 12a to the minor surface area portion 62b of the adjacent smaller area discrete photovoltaic cell 12b. It is in this manner that photogenerated current in the photovoltaic cell 12a passes for collection from cell 12a through the electrically conductive grid fingers 68 to the minor portion of cell 12b which is electrically connected to the electrically conductive substrate 11b thereof. The grid fingers 68 can be connected to the substrate 11 by first burnishing the layers of semiconductor alloy material or by welding or riveting (as at 70a, 70b and 70c) directly thereto. The isolation groove 56b exposes the substrate 52 and prevents the current from passing directly from the grid fingers associated with and affecting the electrical interconnection in series between, one set of adjacent photovoltaic cells 12a and 12b to the grid fingers 68 associated with the second set of adjacent photovoltaic cells 12b and 12c.

It should, at this point, become apparent that in this manner a series connected array of discrete smaller area photovoltaic cells 12 are thereby formed from the single continuous web of photovoltaic cell material 52. While the entire roll of the web of photovoltaic cell material 52 is similarly electrically interconnected such that the smaller area cells 12 thereof are electrically connected in series, the number of smaller area cells 12 which are to be selectively severed from the roll is dependent upon the desired voltage required by the downstream use. Since the smaller area photovoltaic cells are electrically connected in series, the voltage of each cell adds and the user may select the desired voltage for a particular application. Finally, note that, while not illustrated, for purposes of improved current collection, bus bars may be utilized, said bus bars being operatively disposed so as to extend transverse to the direction of extension of the electrically conducting grid lines.

It should also be noted that in the same manner that the isolation grooves 56 prevent photogenerated current from being shunted between adjacent electrically conductive grid lines 68, the electrically insulating material 66, which fills the slitted space between adjacent discrete smaller area photovoltaic cells 12 prevents shunt paths from developing between adjacent discrete smaller area cells 12. Therefore, the electrical interconnection which exists between discrete smaller area cells 12 extends across said insulated slits whereby the upper major surface area electrode 60 of each smaller area cell 12 is electrically interconnected to the contiguous minor surface area electrode 62 of the adjacent smaller area cell 12. While this slitted space 54 is preferably filled with insulating material 66, that material is not essential, but, rather is a safeguard against short circuiting. The insulating material also provides added rigidity and strength to the web. It is also important to note that, while not illustrated, bypass diodes may be placed across each small area segment between the electrically interconnected cells 12.

Figure 4E:
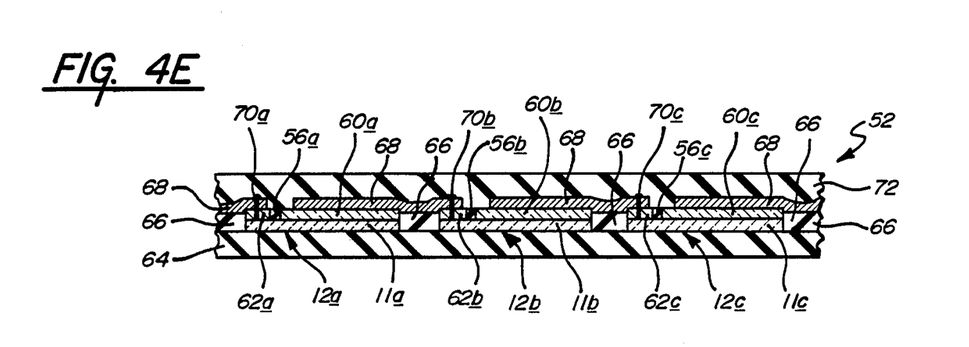
FIG. 4E is a partial cross-sectional view illustrating the continuous web of photovoltaic cell material of FIG. 3E with an upper encapsulant added thereupon.

Referring now to FIG. 4E, the elongated, continuous web of photovoltaic cell material 52, as configured with said smaller area cells electrically interconnected in series in the manner described in detail with respect to FIGS. 3D and 4D hereinabove, said roll of interconnected cells is now illustrated with an upper protective laminant, generally designated by the reference numeral 72, disposed on the non-encapsulated upper surface thereof. This laminant 72 is light transmissive and provides a seal which protects against the ambient environment and is thus adapted to protect the underlying discrete smaller area photovoltaic cells 12 from deterioration due to environmental conditions. The top encapsulating laminant 72 may be formed from any synthetic plastic resin such as a fluorinated polymer, i.e., PFA or Tedlar (registered Trademark of Dupont Corporation) or a hard, transparent plasma deposited coating such as stoichiometric silicon dioxide, silicon nitride, etc.

Figure 3E:
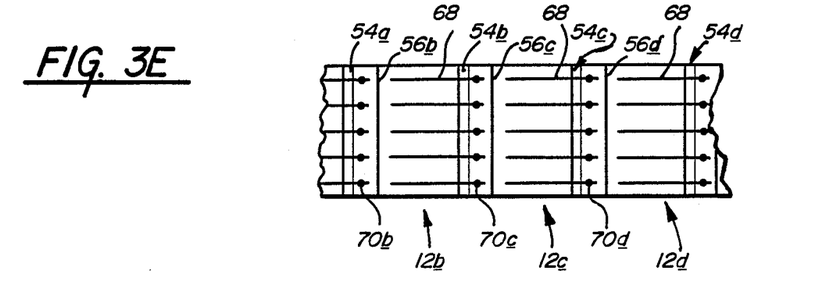
FIG. 3E is a top plan view illustrating the continuous web of photovoltaic cell material of FIG. 3D as that web is severed to form a plurality of discrete, electrically interconnected smaller area photovoltaic cells.

Finally, and specifically turning to FIG. 3E, there is illustrated therein an array of three discrete smaller area photovoltaic cells 12a, 12b and 12c, which cells have been severed from the continuous smaller area web of photovoltaic cell material 52. The series connected smaller area cells were severed from the photovoltaic cell material 52 so as to obtain a desired voltage therefrom. Obviously, while three cells are illustrated as having been severed, that number is arbitrary and any number of cells can be selected depending only upon the voltage requirements of a particular application. Typically 13 cells are interconnected so as to provide for 12 V battery charging applications. It is further important to note that the smaller area cells 12 are defined by the slits 54 to be about twelve inches long and two inches wide so that auxiliary grid fingers are not needed. However, by either incorporating auxiliary grid fingers or by decreasing the resistivity of the TCO, the width of the strips may be increased.

It should be understood that the present invention is not limited to the precise structure illustrated in the aforedescribed embodiments. It is intended that the foregoing description of the presently preferred embodiments be regarded as illustrative rather than as a limitation of the present invention. Therefore, it is the claims which follow, including all equivalents, which are intended to define the scope of the subject invention.

We claim:

1. A method of continuously electrically interconnecting in series a continually moving array of discrete photovoltaic cells formed from a single large area photovoltaic cell, said method including the steps of:

providing an elongated, continuous web of photovoltaic cell material, said continuous web comprising a continuous substrate upon which a plurality of continuous thin film layers of semiconductor alloy material are disposed;

continuously moving said photovoltaic cell material to a take-up station;

forming n slits, where n is an integer equal to or greater than 1, photovoltaic cell material for dividing said material into n+1 smaller area cells; each said slit extending through the semiconductor alloy material and the substrate and being of a length selected to include a non-slitted connector between each terminus of said slit and the edge of said cell proximate thereto so that said connectors are adapted to maintain the structural integrity of said elongated web;

establishing electrical series communication between adjacent smaller area cells disposed on opposite sides of said slit; and severing said connectors, whereby said continuous web of photovoltaic cell material is converted into an array of discrete photovoltaic cells electrically interconnected in series.

2. A method as in claim 1, including the further step of electrically isolating a minor portion of the surface of each discrete cell from a major portion of the surface of each discrete cell.

3. A method as in claim 2, wherein said step of electrically isolating comprises forming grooves through the layers of semiconductor alloy material.

4. A method as in claim 2, wherein said step of electrically isolating comprises removing the layers of semiconductor alloy material from the substrate.

5. A method as in claim 2, including the further step of insulating the slits so that adjacent cells are electrically isolated from one another.

6. A method as in claim 5, wherein the step of isolating adjacent cells comprises laminating the back surface of the substrate with an electrically insulating material; and insulating the slitted space between adjacent cells with an electrically insulating material.

7. A method as in claim 5, wherein the step of isolating adjacent cells comprises: utilizing an electrically insulating substrate and depositing a common layer of electrically conductive material prior to slitting said cells; and insulating the slitted space between adjacent cells with an electrically insulating material.

8. A method as in claim 6, including the further step of electrically interconnecting adjacent cells across said insulated slit.

9. A method as in claim 8, wherein the step of interconnecting cells across said slit comprises forming a plurality of electrically conductive grid lines, which lines extend from said major portion of said surface of one discrete cell to said minor portion of said surface of said adjacent discrete cell, whereby the upper surface of said one cell is electrically connected in series to the lower surface of said adjacent cell.

10. A method as in claim 8, including the further step of electrically interconnecting in series a plurality of discrete cells so as to obtain a desired voltage therefrom.

11. A method as in claim 10, including the further step of encapsulating the the upper surface of said cells with an electrically insulating material.

12. An improved method of electrically connecting in series an array of smaller area photovoltaic cells formed from a continuous elongated web of photovoltaic cell material, said web formed from continuous layers of semiconductor alloy material deposited onto an elongated web of substrate material; said method including the steps of:

forming a plurality of discrete smaller area photovoltaic cells from said web of cell material; and electrically interconnecting said discrete cells in series while maintaining said web in continuous motion.

13. A method as in claim 12, including the further step of forming at least one slit in said elongated web of cell material, each said slit extending through the semiconductor alloy material and the substrate and being of a length selected to include a non-slitted connector between each terminus of said slit and the edge of said cell proximate thereto.

14. A method as in claim 13, wherein electrical communication between adjacent discrete cells on opposite sides of said slits is established by filling said slitted space with electrically insulating material and forming electrically conductive grid lines thereacross.

15. A method as in claim 14, including the further step of laminating both sides of the array of series connected smaller area photovoltaic cells.

* * * * *